United States Patent
Lin et al.

(10) Patent No.: US 6,759,145 B2
(45) Date of Patent: Jul. 6, 2004

(54) WHITE LIGHT EMITTING ORGANIC ELECTROLUMINESCENT DEVICE AND METHOD FOR FABRICATING THE SAME

(75) Inventors: Ming-Der Lin, Hsinchu (TW); San Bao Lin, Jungli City (TW); Feng-Ju Chuang, Hsinchu (TW)

(73) Assignee: Opto Tech Corporation, Hsinchu (TW)

( * ) Notice: Subject to any disclaimer, the term of this patent is extended or adjusted under 35 U.S.C. 154(b) by 144 days.

(21) Appl. No.: 09/993,682

(22) Filed: Nov. 27, 2001

(65) Prior Publication Data

US 2003/0099860 A1 May 29, 2003

(51) Int. Cl.⁷ .......................... H05B 33/14; H05B 33/10
(52) U.S. Cl. ........................ 428/690; 428/917; 427/66; 313/502; 313/504; 313/506
(58) Field of Search ................................ 428/690, 917, 428/66, 212; 313/502, 504, 506; 427/66

(56) References Cited

U.S. PATENT DOCUMENTS

| | | | |
|---|---|---|---|
| 5,405,709 A | * | 4/1995 | Littman et al. ............. 428/690 |
| 5,503,910 A | * | 4/1996 | Matsuura et al. ........... 428/212 |
| 5,683,823 A | * | 11/1997 | Shi et al. .................... 428/690 |
| 6,387,546 B1 | * | 5/2002 | Hamada et al. ............. 428/690 |
| 2001/0053462 A1 | * | 12/2001 | Mishima ..................... 428/690 |
| 2002/0021088 A1 | * | 2/2002 | Howard et al. ............. 313/504 |
| 2002/0168544 A1 | * | 11/2002 | Fukuoka et al. ............ 428/690 |
| 2003/0068524 A1 | * | 4/2003 | Hatwar ....................... 428/690 |

FOREIGN PATENT DOCUMENTS

JP 11-329734 * 11/1999

OTHER PUBLICATIONS

Faguang Xuebao (2000), 21(4), pp. 369–372.*
Guangdianzi Jiguang/Journal of Optoelectronics Laser, vol. 12, No. 2, Feb. 2001, pp. 112–115.*
"White light–emitting organic electroluminescent devices using the poly(n–vinylcarbazole emitter layer doped with three fluorescent dyes", Applied Physics Letters, Feb. 14, 1994, vol. 64, Issue 7, abstract (p. 815).*

* cited by examiner

Primary Examiner—Dawn L. Garrett
(74) Attorney, Agent, or Firm—Rosenberg, Klein & Lee

(57) ABSTRACT

The present invention discloses a white light emitting organic electroluminescent (EL) device and a method for fabricating the same. The device comprises: a substrate; an anode formed on the substrate; at least one hole transporting layer formed on the anode; at least one luminescent layer (DPVBi) formed on the hole transporting layer, wherein a first dopant ($DCM_2$) is doped into the luminescent layer; at least one electron transporting layer formed on the luminescent layer, wherein a second dopant ($C_6$) is doped into the electron transporting layer; and a cathode formed on the electron transporting layer; wherein a first light (red) is emitted by the first dopant, a second light (green) is emitted by the second dopant, and a third light (blue) is emitted by the luminescent layer when the device is applied with a bias voltage.

9 Claims, 4 Drawing Sheets

WHITE LIGHT EMITTING ORGANIC ELECTROLUMINESCENT DEVICE AND METHOD FOR FABRICATING THE SAME

BACKGROUND OF THE INVENTION

1. Field of the Invention

The present invention generally relates to an organic electroluminescent (EL) device (also known as OELD) and a method for fabricating the same, and more particularly, to a white light emitting organic electroluminescent device able to directly emit continuous full color light containing three different frequency bands and a method for fabricating such an organic electroluminescent device easily and with high precision. This invention can effectively simplify the fabrication procedure and improve the luminescence efficiency.

2. Description of the Prior Art

The organic electroluminescent device, upon which C. W. Tang and S. A. Van Slyke (Eastman Kodak Company, Rochester, N.Y.) have made efforts since 1987 to form hetero-structures by employing aluminum trisoxine [a.k.a., tris(8-quinolinol)aluminum] by vacuum evaporation, has attracted tremendous attention due to its advantages over other display panels. These advantages include self-luminescence, large visual angle, short response time, compact size, light weight, reduced dimension in thickness, high brightness, low power consumption, simple fabrication, and the ability for light emitting in a full color range. Therefore, such an organic electroluminescent device is increasingly required to replace the currently used white light sources such as fluorescent lamps and light bulbs so as to save energy, and the technologies thereon have widely been studied in the industry all over the world.

Please refer to FIG. 1, which is a cross-sectional view showing the structure of an organic EL device disclosed in U.S. Pat. No. 4,769,292, issued Sep. 6, 1988, filed Oct. 14, 1987 by Van Slyke et al (Eastman Kodak Company, Rochester, N.Y.), entitled "Electroluminescent device with modified thin film luminescent zone." The organic EL device 10 comprises in sequence: a transparent substrate 11, light transmissive anode 13 formed of tin oxide or indium tin oxide (ITO) by evaporation, an organic hole injecting and transporting zone 15, a luminescent zone 17, and a cathode 19. The luminescent zone 17 is formed by a thin film comprised of an organic host material capable of sustaining hole and electron injection and a fluorescent material (not shown) capable of emitting light in response to hole-electron recombination. When an external voltage is applied to the device 10, the anode 13 injects holes (positive charge carriers) into the luminescent medium 17 while the cathode 19 injects electrons into the luminescent medium 17. The portion of the luminescent medium 17 adjacent the anode 13 thus forms a hole injecting and transporting zone 15. The injected holes and electrons each migrate toward the oppositely charged electrode. This results in hole-electron recombination within the organic luminescent medium 17, which leads to energy released as light according to the chosen fluorescent material.

The fore-mentioned prior art organic EL device has advantages in good quality and enduring lifetime. However, the structure employed can only emit monochromatic lights according to various chosen fluorescent materials, and fail to achieve the objects of emitting white light or continuous full color light.

Please refer to FIG. 2, which is a schematic band diagram showing the structure of an organic EL device disclosed in U.S. Pat. No. 5,668,438, issued Sep. 16, 1997, filed Jun. 6, 1996 and U.S. Pat. No. 5,886,464, issued Mar. 23, 1999, filed Apr. 18, 1997 by Shi et al (Motorola, Inc., Schaumburg, Ill.), both entitled "Organic electroluminescent device with emission from hole transporting layer." In the EL structure, an anode 22 is formed of tin oxide or indium tin oxide (ITO), an organic hole transporting layer 23 is formed on the anode 22, an organic electron transporting layer 24 is formed on the hole transporting layer 23, and a cathode 25 is formed on the electron transporting layer 24. The materials for the hole and electron transporting layers 23 and 24 are so selected as to satisfy the following inequality:

$$(E_{C1}-E_{C2})<(E_{V1}-E_{V2})$$

where $E_{C1}$ and $E_{V1}$ respectively represent a conduction band level and a valence band level of the material selected for the hole transporting layer 23; and $E_{C2}$ and $E_{V2}$ respectively represent a conduction band level and a valence band level of the material selected for the electron transporting layer 24.

The inequality ensures that the energy barrier for holes to be injected into the valence band of electron transporting layer 24 from the valence band of hole transporting layer 23 is greater than that for electrons to be injected into the conduction band of the hole transporting layer 23 from the conduction band of electron transporting layer 24. In other words, the number of electrons to be injected from the electron transporting layer 24 into the hole transporting layer 23 is much larger than the number of holes to be injected from the hole transporting layer 23 into the electron transporting layer 24. Therefore, electrons and holes recombine in the part of hole transporting layer 23 close to the interface of electron transporting layer 24 and hole transporting layer 13, where light emission occurs. Moreover, in order to facilitate holes to be injected into the hole transporting layer 23 from the anode 22, the EL structure further provides a hole injection layer interposed between the anode 22 and the hole transporting layer 23.

Although the fore-mentioned prior art organic EL device has high electroluminescence efficiency due to light emission from the hole transporting layer 23. However, the structure employed can only emit monochromatic lights according to various chosen fluorescent materials, and fail to achieve the objects of emitting white light or continuous full color light.

In recent years, there are several methods that have been investigated and developed by the industry to realize an organic EL device capable of emitting white light or full color light, including:

1. Color conversion: In this method, a monochromatic light passes through a color conversion material composed of different color conversion layers and is then resolved and converted into light with different colors, e.g. three primary colors, such as red, blue, and green so that an organic EL device capable of emitting white light or full color light can be obtained. However, this method also suffers from a number of problems. First, most of the available color conversion materials are not satisfactory in color purity and luminescence efficiency. Secondly, the background light (such as blue light and UV light) may also be absorbed by the color conversion layers, which often leads to poor contrast and defective pixel quality. And thirdly, the color conversion process is performed by a two-wavelength approach; therefore, chromatic aberration may occur.

2. Color filter: In this method, white light is used as the back-lighting source of the organic EL material. It is useful to achieve full color light when accompanied by LCD color filters. However, the key problem of this method is how to obtain a reliable white light.

3. Three independent colors (RBG): In this method, three primary colors red (R), green (G) and blue (B) are independently demonstrated to realize a full color display or a white light source. However, since the three colors are independently demonstrated, RBG pixels require different driving voltages. A multicolor organic light emitting device thus formed is disclosed in U.S. Pat. No. 5,703,436, issued Dec. 30, 1997, filed Mar. 6, 1996 by Forrest et al (Princeton University, Princeton, N.J.), entitled "Transparent contacts for organic devices." It suffers from complicated fabrication process and larger size. In addition, in such a device, high precision is critically required for the RBG pixels. As shown in FIG. 3, which is a 3-dimensional view showing the structure of an organic EL device disclosed in U.S. Pat. No. 5,952,037, issued Sep. 14, 1999, filed May 8, 1997 by Nagayama et al (Pioneer Electronic Corporation, Tokyo, JP), entitled "Organic electroluminescent display panel and method for manufacturing the same." The organic EL device comprises: a substrate 30 on which a plurality of first display electrodes 32 corresponding to emitting portions are formed; electrical insulation ramparts 34 projecting from the substrate 30 for exposing at least portions of the first display electrodes 32 respectively; organic function layers 36 each including at least one organic electroluminescent medium formed on exposed portions of the first display electrodes 32; second display electrodes 38 formed on the organic function layers 36; and each electrical insulation rampart having an overhanging portion 385 projecting in a direction parallel to the substrate preferably at an upper part thereof. It is found that the fabrication process may be difficult and complicated. On one hand, the RBG pixels formed of three different organic EL materials are employed may have different luminescence efficiencies, lifetimes, driving conditions. For example, the red light shows poor purity and may shift to orange color. The red light also has shorter lifetime and may adversely affect the overall performance of the display. On the other hand, the method is performed by a two-wavelength approach; therefore, chromatic aberration may occur.

SUMMARY OF THE INVENTION

Therefore, the present invention has been made to solve such problems in view of the forgoing status and to further provide a method for fabricating a white light emitting organic electroluminescent (EL) device able to directly emit continuous full color light containing three different frequency bands so as to realize white light emitting.

It is the primary object of the present invention to provide a white light emitting organic electroluminescent device, incorporating a luminescent layer, an electron transporting layer, and dopant materials to realize continuous full color light containing three different frequency bands with better color uniformity and improve the luminescence efficiency.

It is another object of the present invention to provide a white light emitting organic electroluminescent device so as to realize white light with better full color display quality.

It is still another object of the present invention to provide a white light emitting organic electroluminescent device, incorporating a bias voltage, instead of three independent driving voltages, to emit three primary colors (red, green and blue), so as to simply the fabrication process, downsize the device and reduce the cost.

It is still another object of the present invention to provide a white light emitting organic electroluminescent device to replace the currently used white light sources such as fluorescent lamps and light bulbs so as to save energy.

It is still another object of the present invention to provide a white light emitting organic electroluminescent device, incorporating a doping technique to realize continuous full color light containing three different frequency bands with better color uniformity and improve the luminescence efficiency.

In order to achieve the foregoing objects, the present invention provides a white light emitting organic electroluminescent device, comprising: a substrate; an anode formed on said substrate; at least one hole transporting layer formed on said anode; at least one luminescent layer formed on said hole transporting layer, wherein a first dopant is doped into said luminescent layer; at least one electron transporting layer formed on said luminescent layer, wherein a second dopant is doped into said electron transporting layer; and a cathode formed on said electron transporting layer; wherein a first light is emitted by said first dopant, a second light is emitted by said second dopant, and a third light is emitted by said luminescent layer when the device is applied with a bias voltage.

The present invention further provides a method for fabricating a white light emitting organic electroluminescent device, comprising the steps of: providing a substrate; forming, in sequence from substrate up, an anode, at least one hole transporting layer, at least one luminescent layer, at least one electron transporting layer, and a cathode; doping a first dopant into said luminescent layer; and doping a second dopant into said electron transporting layer.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

BRIEF DESCRIPTION OF THE DRAWINGS

The objects, spirits and advantages of the preferred embodiment of the present invention will be readily understood by the accompanying drawings and detailed descriptions, wherein.

DETAILED DESCRIPTION OF THE INVENTION

The present invention providing a white light emitting organic electroluminescent (EL) device, able to directly emit continuous full color light containing three different frequency bands, can be exemplified by the preferred embodiment as described hereinafter.

Figure 1:
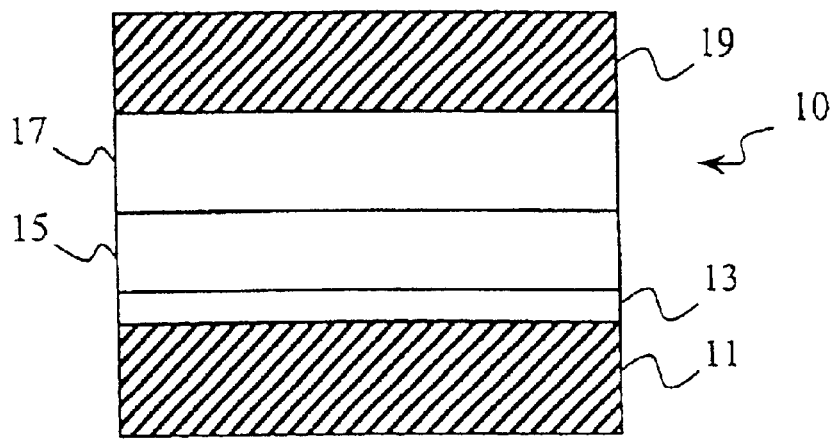
FIG. 1 is a cross-sectional view showing the structure of an organic EL device in accordance with the prior art.
Figure 2:
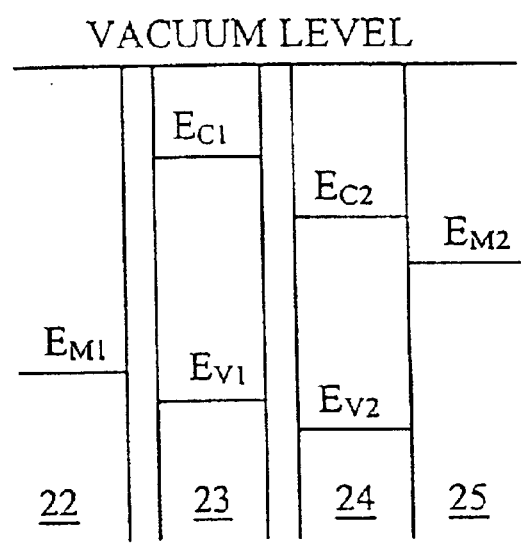
FIG. 2 is a schematic band diagram showing the structure of another organic EL device in accordance with the prior art.
Figure 3:
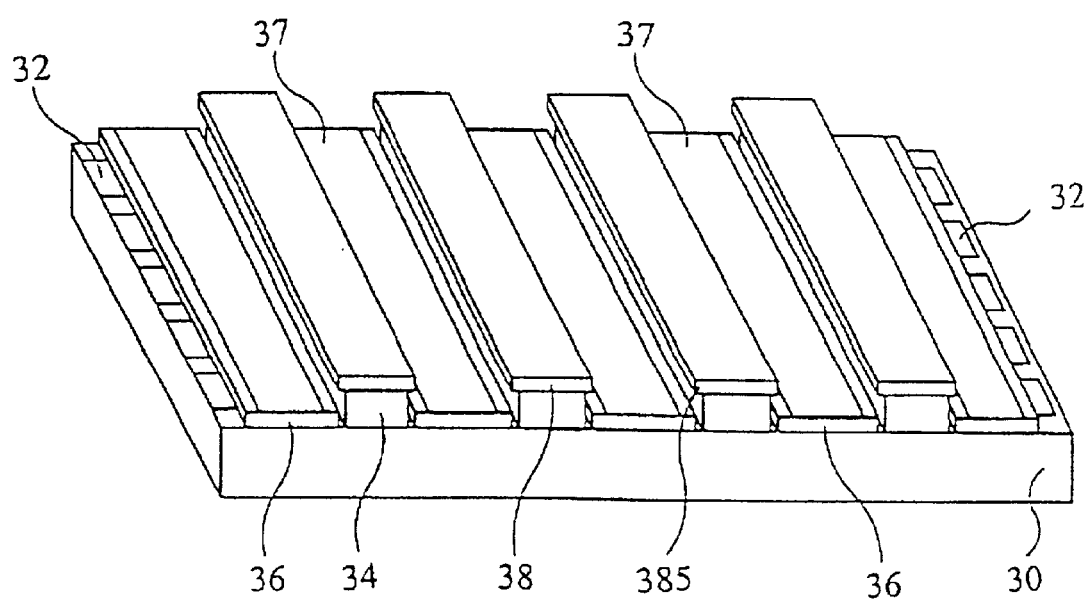
FIG. 3 is a 3-dimensional view showing the structure of still another organic EL device in accordance with the prior art.
Figure 4:
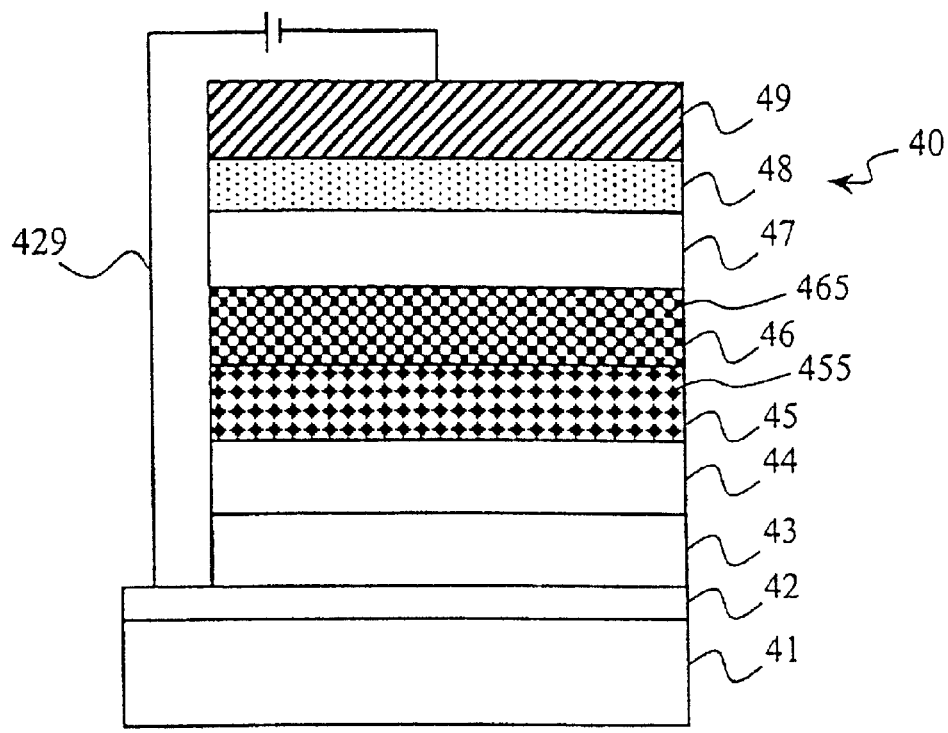
FIG. 4 is a cross-sectional view showing the structure of an organic EL device in accordance with the preferred embodiment of the present invention.

To start with, please refer to FIG. 4, which is a cross-sectional view showing the structure of an organic EL device in accordance with the preferred embodiment of the present invention. As shown in the drawing, the white light emitting organic EL device 40 comprises: a transparent substrate 41 made of plastic or glass; an anode 42 formed of transparent conductive metals, alloys, compounds such as indium tin oxide (ITO), Au, CuI, $SnO_2$, ZnO by evaporation or sputtering on the substrate 41; a hole injection layer 43 formed of hole injection materials such as copper phthalocyanine (CuPc) by evaporation on the anode 42; a hole transporting layer 44 formed of materials such as N,N'-bis-(1-naphthy)-N,N'diphenyl-1,1'-biphenyl-4-4'-diamine (NPB), TPD, Spiro-NPB, Spiro-TAD and m-MTDATA on the hole injection layer 43; a luminescent layer 45 formed of materials such as 1,4-bis(2,2-diphenylvinyl)biphenyl (DPVBi), Balq, PVK and $Zn(ODZ)_2$ on the hole transporting layer 44, wherein a first dopant 455 composed of luminescent medium or phosphorescent medium is doped into the luminescent layer 45; an electron transporting layer 46 formed of materials such as tris(8-quinolinol)aluminum, TAZ, PBD and $Zn(ODZ)_2$ on the luminescent layer 45, wherein a second dopant 465 composed of luminescent medium or phosphorescent medium is doped into the electron transporting layer 46; a cap layer (second electron transporting layer) 47 is formed of materials such as tris(8-quinolinol) aluminum, TAZ, PBD and $Zn(ODZ)_2$ on the electron transporting layer 46; an electron injection layer 48 and a cathode 49 formed of conductive metals, alloys, compounds such as LiF, Mg/Ag, Al/Li, $Al/Li_2O$, Ca and Al on the second electron transporting layer 47.

The first dopant and the second dopant can be implemented by using luminescent medium such as 4-Dicyanomethlene-2-methyl-6-[2-(2,3,6,7-tetra-hydro-1H, 5H-benzo[ij]quinolizin-8-yl)vinyl]-4H-pyran ($DCM_2$), $DCM_1$, DCJTB, coumarin 545T, perylene or phosphorescent medium such as PtOEOP.

Figure 5:
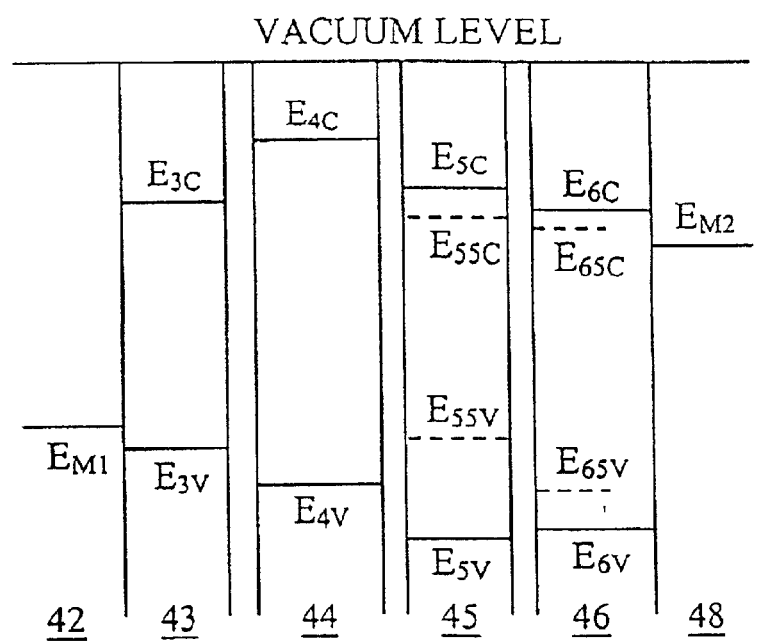
FIG. 5 is a schematic band diagram showing the structure of an organic EL device in accordance with the preferred embodiment of the present invention.

Please also refer to FIG. 5, which is a schematic band diagram showing the structure of an organic EL device in accordance with the preferred embodiment of the present invention. In the drawing, $E_{XC}$ denotes the energy gap between the vacuum level and the conduction band of the material, also known as electron affinity, while $E_{XV}$ denotes the energy gap between the vacuum level and the valence band of the material, also known as ionization potential.

As shown in the band diagram, as the electron affinity gets larger and the conduction band discontinuity at the interface between two materials gets smaller, electrons are most likely to be injected. Therefore, when an external voltage is applied from a power supply, electrons easily transport from $E_{M2}$ of the electron injection layer 48 through the electron transporting layer 46 into the luminescent layer 45. Moreover, because the conduction band discontinuity at the interface between the valence band energy $E_{5C}$ of the luminescent layer 45 and the conduction band energy $E_{4C}$ of the hole transporting layer 44 is much larger than the fore-mentioned conduction band discontinuity at the interface between the valence band energy $E_{5C}$ of the luminescent layer 45 and the conduction band energy $E_{6C}$ of the electron transporting layer 46, there is less probability for electrons to enter the hole transporting layer 44 from the luminescent layer 45. As a result, most of the injected electrons accumulate in the luminescent layer 45 and the electron transporting layer 46.

On the other hand, holes injected from the anode 42 through the hole injection layer 43 and the hole transporting layer 44 enter the luminescent layer 45 due to the decreasing valence band ($E_{M1}$, $E_{3V}$, $E_{4V}$, $E_{5V}$). Meanwhile, the injected holes and electrons recombine in the luminescent layer 45 to be elevated to an excited state. When the energy level returns from the excited state to the ground state, part of energy is released as blue light emitted from the DPVBi material and part of energy is released as red light emitted from the first dopant ($DCM_2$) 455. It is noted that the energy gap between $E_{55C}$ and $E_{55V}$ for the first dopant is smaller than the energy gap between $E_{5C}$ and $E_{5V}$ for the DPVBi.

Furthermore, since the mobility of holes in the hole transporting layer 44 is much higher than the mobility of electrons in the electron transporting layer 46, a certain amount of holes may inject into the electron transporting layer 46. Those holes and electrons recombine in the electron transporting layer 46 to be elevated to an excited state. When the energy level returns from the excited state to the ground state, energy is released as green light emitted from the second dopant ($C_6$) 465. It is noted that the energy gap between $E_{65C}$ and $E_{65V}$ is for the second dopant. Accordingly, the organic EL device 40 has emitted three primary colors (RGB) by using a bias voltage, instead of applying three driving voltages, so that white light emitting continuous full color light containing three different frequency bands can be realized.

The present invention can be implemented by an exemplary embodiment. The fabrication steps and experimental result are shown as follows:

1. By using evaporation or sputtering, an anode 42 formed of indium oxide (ITO) is deposited on a transparent glass substrate 41. The thickness of the ITO film is about 1500 Å.

2. After conventional cleaning steps, such as 5 minutes in isopropyl alcohol, 5 minutes in de-ionized water, and 5 minutes in isopropyl alcohol in an ultrasonic vibrator, the residual isopropyl alcohol is removed from the substrate by nitrogen or any other purified gas and then UV and/or ozone treatment is performed on the sample.

3. In a high vacuum environment, set at $5 \times 10^{-6}$ Torr, hole injection material such as CuPc is deposited by evaporation on the anode 42. The hole injection layer 43 thus formed is 120 Å in thickness. Thereafter, a hole transporting layer (NPB) 44 is formed to have a thickness of 500 Å on the hole injection layer 43.

4. A first dopant ($DCM_2$) 455 is doped into a luminescent layer 45, which is formed to be in the range from 20 Å to 150 Å in thickness on the hole transporting layer (NPB) 44. The volume ratio of the first dopant ($DCM_2$) 455 to the luminescent layer 45 is in the range from 0.04% to 0.01%.

5. A second dopant ($C_6$) 465 is doped into an electron transporting layer ($Alq_3$) 46, which is formed about 50Å on the luminescent layer 45. The volume ratio of the second dopant ($C_6$) 465 to the electron transporting layer ($Alq_3$) 46 is in the range from 0.05% to 0.2%.

6. A second electron transporting layer ($Alq_3$) 47 is formed to be 200Å in thickness on the electron transporting layer ($Alq_3$) 46. The second electron transporting layer ($Alq_3$) 47 can serve as a cap layer. The deposition rate employed during the foregoing steps is in the range from 1 Å/sec to 5 Å/sec.

7. Electron injection material such as LiF is deposited by evaporation on the second electron transporting layer 47 to form an electron injection layer 48 about 5 Å and a cathode (Al) 49 about 200 Å.

According to the fabrication procedure discussed above, a white light emitting organic electroluminescent (EL) device can realize continuous fill color light containing three different frequency bands with better color uniformity and improve the luminescence efficiency.

Figure 6:
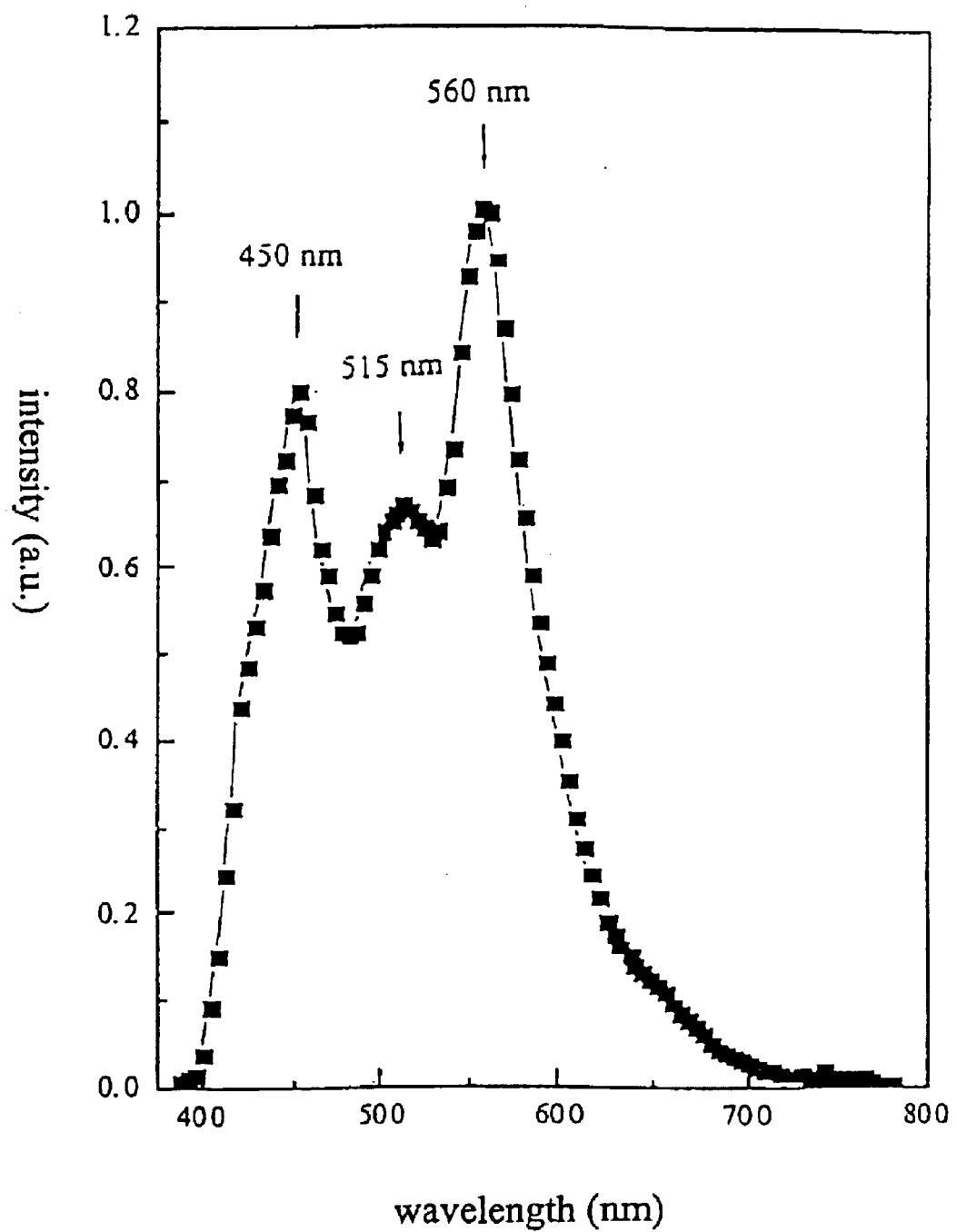
FIG. 6 is a graph showing the experimental result of the relation between luminescence intensity and wavelength in accordance with the present invention.

FIG. 6 is a graph showing the experimental result of the relation between luminescence intensity and wavelength in accordance with the present invention. In the drawing, there are three peaks corresponding to the wavelengths for the three primary colors, i.e., 560 nm for the red light, 515 nm for the green light and 450 nm for the blue light. It is thus evident that white light and full color display can be realized.

Furthermore, according to the experiment results of the disclosed organic EL device of the present invention, it is found that the luminescence intensity profile of the three primary colors (RBG) is strongly dependent on the volume ratio of the first dopant ($DCM_2$) 455 to the luminescent layer 45. Our experiment results show that the luminescence intensity of the blue light and the green light tremendously drops if the volume ratio gets higher. Preferably, the volume ratio is 0.025% if white light is required. Moreover, the purity of white light together with the luminescence efficiency also depends on the thickness of DPVBi. Our experiment results demonstrate that the thickness of DPVBi is proportional to the blue light intensity, but in inverse proportion to the green light intensity. Preferably, the thickness of DPVBi is 90 Å if white light is required.

Finally, please refer to Table I for comparison. The chromaticity coordinate is shown concerning that the thickness of DPVBi is 90 Å, the volume ratio is 0.025%, and white light intensity is 100 $cd/m^2$ and 1000 $cd/m^2$, respectively.

TABLE I

| volume ratio (%) | DPVBi thickness (Å) | intensity (100 $cd/m^2$) | intensity (1000 $cd/m^2$) |
| --- | --- | --- | --- |
| 0.025 | 90 | X = 0.30<br>Y = 0.37 | X = 0.30<br>Y = 0.36 |

It is evident from Table I that the chromaticity coordinate obtained is (X=0.30, Y=0.36), which is nearly equal to (X=0.30, Y=0.36) that "Commission Internationale de 1' Eclairage 1931" has claimed to be an ideal chromaticity coordinate for white light. Therefore, the preferred embodiment of the present invention has successfully realized a perfect white light.

The above results were obtained at the operating voltage of 2.5 volts. If the operating voltage increases to 9 volts, the intensity becomes 8800 $cd/m^2$ and the maximum efficiency is 51 m/w.

According to the above discussion, the present invention discloses a white light emitting organic electroluminescent (EL) device, incorporating a bias voltage, instead of three independent driving voltages, to emit three primary colors (red, green and blue), so as to simply the fabrication process, downsize the device and reduce the cost. Therefore, the present invention has been examined to be progressive, advantageous and applicable to the industry.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A white light emitting organic electroluminescent organic (EL) device comprising:
    a substrate;
    an anode formed on said substrate;
    at least one hole transporting layer formed on said anode;
    at least one luminescent layer formed on said hole transporting layer, wherein a first dopant is doped into said luminescent layer;
    at least one electron transporting layer formed on said luminescent layer, wherein a second dopant is doped into said electron transporting layer; and,
    a cathode formed on said electron transporting layer;
    wherein a first light is emitted by said first dopant, a second light is emitted by said second dopant, and a third light is emitted by said luminescent layer when the device is applied with a bias voltage; and,
    wherein the luminescence intensity of said second light and said third light is proportional to the volume ratio of said first dopant to said luminescent layer.

2. The organic EL device as recited in claim 1, wherein the volume ratio of said first dopant to said luminescent layer is in the range from 0.04% to 0.01%.

3. The organic EL device as recited in claim 2, wherein the volume ratio of said first dopant to said luminescent layer is preferably 0.025%.

4. A white light emitting organic electroluminescent organic (EL) device comprising:

a substrate;

an anode formed on said substrate;

at least one hole transporting layer formed on said anode;

at least one luminescent layer formed on said hole transporting layer, wherein a first dopant is doped into said luminescent layer;

at least one electron transporting layer formed on said luminescent layer, wherein a second dopant is doped into said electron transporting layer; and, a cathode formed on said electron transporting layer;

wherein a first light is emitted by said first dopant, a second light is emitted by said second dopant, and a third light is emitted by said luminescent layer when the device is applied with a bias voltage; and, wherein the luminescence intensity of said third light is proportional to the thickness of said luminescent layer and the luminescence intensity of said second light is in inverse proportion to the thickness of said luminescent layer.

5. A white light, organic electroluminescent (EL) device, comprising:

a substrate;

an anode formed on said substrate;

at least one hole transporting layer formed on said anode;

at least one luminescent layer formed on said hole transporting layer, wherein a first dopant is doped into said luminescent layer;

at least one electron transporting layer formed on said luminescent layer, wherein a second dopant is doped into said electron transporting layer; and a cathode formed on said electron transporting layer;

wherein a first light is emitted by said first dopant, a second light different in color from said first light is emitted by said second dopant, and a third light different in color from said second light is emitted by said luminescent layer when the device is applied with a bias voltage, said first light being red light, said second light being green light, and said third light being blue light.

6. A white light organic electroluminescent (EL) device, comprising:

a substrate;

an anode formed on said substrate;

at least one hole transporting layer formed on said anode;

at least one luminescent layer formed on said hole transporting layer, wherein a first dopant is doped into said luminescent layer, said luminescent layer being selected from the group consisting of: DPVBi, Balq, PVK, $Zn(ODZ)_2$, and a combination thereof;

at least one electron transporting layer formed on said luminescent layer, wherein a second dopant is doped into said electron transporting layer; and a cathode formed on said electron transporting layer;

wherein a first light is emitted by said first dopant, a second light different in color from said first light is emitted by said second dopant, and a third light different in color from said second light is emitted by said luminescent layer when the device is applied with a bias voltage, said third light being blue light.

7. A method for fabricating a white light emitting organic electroluminescent (EL) device, comprising the steps of:

providing a substrate; forming, in sequence from substrate up, an anode, at least one hole transporting layer, at least one luminescent layer, at least one electron transporting layer, and a cathode;

doping a first dopant into said luminescent layer; and doping a second dopant into said electron transporting layer;

wherein a first light is emitted by said first dopant, a second light is emitted by said second dopant, and a third light is emitted by said luminescent layer when the device is applied with a bias voltage; and, wherein said luminescent layer is DPVBi for emitting blue light, said first dopant is $DCM_2$ for emitting red light, said second dopant includes a coumarin 6 dye material for emitting green light.

8. The method as recited in claim 7, wherein the luminescence intensity of green light and blue light depends on the ratio of $DCM_3$ to DPVBi.

9. A method for fabricating a white light emitting organic electroluminescent (EL) device, comprising the steps of:

providing a substrate; forming, in sequence from substrate up, an anode, at least one hole transporting layer, at least one luminescent layer, at least one electron transporting layer, and a cathode;

doping a first dopant into said luminescent layer; and doping a second dopant into said electron transporting layer;

wherein a first light is emitted by said first dopant, a second light is emitted by said second dopant, and a third light is emitted by said luminescent layer when the device is applied with a bias voltage; and, wherein the luminescence intensity of said second light and said third light depends on the thickness of said luminescence layer, wherein the luminescence intensity of said second light gets weaker and the luminescence intensity of said third light gets stronger as the thickness of said luminescent layer increases.

* * * * *